(12) United States Patent
Sugimoto

(10) Patent No.: US 10,444,493 B2
(45) Date of Patent: Oct. 15, 2019

(54) ELECTRO-OPTICAL DEVICE, MANUFACTURING METHOD FOR ELECTRO-OPTICAL DEVICE, AND ELECTRONIC APPARATUS

(71) Applicant: SEIKO EPSON CORPORATION, Tokyo (JP)

(72) Inventor: Yohei Sugimoto, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 150 days.

(21) Appl. No.: 14/805,806

(22) Filed: Jul. 22, 2015

(65) Prior Publication Data

US 2016/0033760 A1  Feb. 4, 2016

(30) Foreign Application Priority Data

Aug. 1, 2014  (JP) .................. 2014-157458

(51) Int. Cl.
*G02B 26/08* (2006.01)
*G02B 26/10* (2006.01)
(Continued)

(52) U.S. Cl.
CPC ........ *G02B 26/0841* (2013.01); *C30B 25/183* (2013.01); *C30B 25/186* (2013.01);
(Continued)

(58) Field of Classification Search
CPC .. G02B 26/0841; G02B 26/0833; G02B 1/14; G02B 5/0858; G02B 1/10; G02B 1/11; G02B 1/111; G02B 1/113; G02B 1/115; G02B 1/116; G02B 1/118; G02B 1/12; G02B 1/16; G02B 1/18; H01L 21/02458; H01L 21/0254; H01L 21/02639; H01L 21/02647; H01L 21/28088; H01L 21/02645; H01L 21/76871; H01L 31/02327; C30B 25/183; C30B 25/186; C30B 25/16; C30B 25/22; C30B 29/02; C30B 29/16; C30B 29/38; C30B 29/68; C30B 29/406; C30B 23/02
(Continued)

(56) References Cited

U.S. PATENT DOCUMENTS 5,631,782 A *  5/1997  Smith .............. G02B 26/0841
                                                  359/214.1
5,650,881 A     7/1997  Hornbeck
(Continued)

FOREIGN PATENT DOCUMENTS

JP  H02-109003 A   4/1990
JP  H07-333542 A  12/1995
(Continued)

*Primary Examiner* — Collin X Beatty
(74) *Attorney, Agent, or Firm* — Oliff PLC

(57) ABSTRACT

An electro-optical device includes a substrate, a mirror support pillar extending in a direction in which the pillar intersects with a surface of the substrate, and a mirror that is so disposed as to be distanced from the substrate and to be capable of being displaced with respect to the mirror support pillar. The mirror has a reflective metal film, and a reflection enhancing lamination film that covers a portion including a surface and a side surface of the reflective metal film.

19 Claims, 9 Drawing Sheets

(51) Int. Cl.
  *G02B 26/12* (2006.01)
  *C30B 25/18* (2006.01)
  *C30B 29/68* (2006.01)
  *C30B 29/16* (2006.01)
  *C30B 29/38* (2006.01)
  *C30B 29/02* (2006.01)
  *G02B 1/14* (2015.01)
  *G02B 5/08* (2006.01)

(52) U.S. Cl.
  CPC .............. *C30B 29/02* (2013.01); *C30B 29/16* (2013.01); *C30B 29/38* (2013.01); *C30B 29/68* (2013.01); *G02B 1/14* (2015.01); *G02B 5/0858* (2013.01)

(58) Field of Classification Search
  USPC .......................................... 359/196.1–226.3
  See application file for complete search history.

(56) References Cited

U.S. PATENT DOCUMENTS

| | | | |
|---|---|---|---|
| 6,046,840 A * | 4/2000 | Huibers | G02B 26/0833 |
| | | | 359/224.1 |
| 6,952,301 B2 * | 10/2005 | Huibers | B82Y 30/00 |
| | | | 359/224.1 |
| 2003/0035197 A1 | 2/2003 | Ikeda et al. | |
| 2006/0238852 A1 * | 10/2006 | Strumpell | G02B 26/0841 |
| | | | 359/291 |
| 2007/0097485 A1 * | 5/2007 | Yang | G02B 26/0841 |
| | | | 359/290 |
| 2007/0097486 A1 | 5/2007 | Yang et al. | |
| 2007/0097487 A1 | 5/2007 | Yang et al. | |
| 2008/0049291 A1 * | 2/2008 | Baek | G02B 5/10 |
| | | | 359/223.1 |
| 2009/0002805 A1 | 1/2009 | Yang et al. | |
| 2009/0233037 A1 * | 9/2009 | Medwick | C03C 17/36 |
| | | | 428/68 |
| 2010/0112492 A1 | 5/2010 | Yang et al. | |
| 2012/0171623 A1 | 7/2012 | Yang et al. | |
| 2014/0168751 A1 * | 6/2014 | Suzuki | G02B 26/08 |
| | | | 359/291 |
| 2014/0192397 A1 * | 7/2014 | Atnip | B81C 1/00642 |
| | | | 359/291 |

FOREIGN PATENT DOCUMENTS

| | | |
|---|---|---|
| JP | H08-227043 A | 9/1996 |
| JP | H10-041383 A | 2/1998 |
| JP | H10-93160 A | 4/1998 |
| JP | H11-2708 A | 1/1999 |
| JP | 2003-021794 A | 1/2003 |
| JP | 2004-133280 A | 4/2004 |
| JP | 2009-514031 A | 4/2009 |
| JP | 2010-14798 A | 1/2010 |
| JP | 2010-256648 A | 11/2010 |
| JP | 2011-138048 A | 7/2011 |
| JP | 2014-92694 A | 5/2014 |

* cited by examiner

ELECTRO-OPTICAL DEVICE, MANUFACTURING METHOD FOR ELECTRO-OPTICAL DEVICE, AND ELECTRONIC APPARATUS

BACKGROUND

1. Technical Field

The present invention relates to electro-optical devices, manufacturing methods for electro-optical devices, and electronic apparatuses.

2. Related Art

As the electronic apparatuses, for example, projectors are well-known in which light emitted from a light source is collected onto a light deflection device which is called a digital micro mirror (DMD) and serves as an electro-optical device, and the collected light is enlarged and projected by a projection optical system so as to be color-displayed on a screen.

The light deflection device is a device in which a plurality of micro mirrors are arranged in matrix form. The micro mirror is formed of a reflective metal film such as an aluminum film, for example, so as to reflect light. However, increase in reflectance of the micro mirror is being required these days in order to obtain higher brightness.

As such, JP-A-10-93160 discloses a technique in which crystal alignment of aluminum is strengthened by forming a titanium layer, a titanium nitride layer, and the like on an aluminum base so that the reflectance of aluminum layer is increased, for example.

However, in the case where a surface of the aluminum layer or a side surface of the titanium layer or the like formed on the aluminum base is oxidized, the volume of the micro mirror is increased. This raises a problem that the micro mirror is bent and becomes incapable of reflecting light in an appropriate manner so that the reflectance of the micro mirror is gradually lowered.

SUMMARY

The aspects of the invention have been conceived to solve at least part of the above problem, and can be realized as the following embodiments or application examples.

APPLICATION EXAMPLE 1

An electro-optical device according to this application example includes a substrate, a mirror that includes a reflective metal film and is so disposed above one surface of the substrate as to be distanced from the substrate, a support section that is disposed between the substrate and the mirror, the support section has a portion connected to part of the mirror to support the mirror, and a reflection enhancing lamination film that is disposed so as to cover at least a part of a surface of the mirror on the opposite side to the substrate and a side surface of the mirror.

According to this application example, because the reflection enhancing lamination film is so provided as to cover the surface and side surface of the reflective metal film, the surface and side surface of the reflective metal film can be suppressed from being oxidized. This makes it possible to suppress a micro mirror including the reflective metal film from being bent and suppress reflectance of the micro mirror from being lowered.

APPLICATION EXAMPLE 2

It is preferable in the electro-optical device according to the above application example that the reflection enhancing lamination film includes a first oxide film and a second oxide film, the second oxide film having a larger refractive index than that of the first oxide film and disposed on a side of the first oxide film opposite to the reflective metal film.

According to this application example, because the reflective metal film is covered with the reflection enhancing lamination film, it is possible to enhance the intensity of light incident on the micro mirror and raise the brightness of light. In other words, the reflectance can be increased.

APPLICATION EXAMPLE 3

It is preferable in the electro-optical device according to the above application example that the first oxide film be made of silicon oxide and the second oxide film be made of silicon nitride.

According to this application example, since the above-mentioned materials are laminated, the reflection enhancing lamination film can be configured by making use of a difference in refractive index between the materials. As such, the intensity of light incident on the micro mirror can be enhanced so that the brightness of light can be raised.

APPLICATION EXAMPLE 4

It is preferable in the electro-optical device according to the above application example that the reflective metal film be made of aluminum.

According to this application example, because aluminum is selected from among reflective metal films and used, it is possible to make use of the characteristics of aluminum such as being highly reflective and being easily processed.

APPLICATION EXAMPLE 5

It is preferable in the electro-optical device according to the above application example that the mirror include, between the reflective metal film and the substrate, a seed lamination film for aligning crystal plane orientations.

According to this application example, because the reflective metal film is formed on the seed lamination film, alignment of the reflective metal film can be strengthened (in other words, alignment can be strengthened in a predetermined plane orientation). Accordingly, generation of unevenness in the surface of the reflective metal film can be suppressed.

APPLICATION EXAMPLE 6

It is preferable in the electro-optical device according to the above application example that the seed lamination film be a lamination film including a titanium nitride layer which is disposed between the reflective metal film and the substrate, and a titanium layer which is disposed between the titanium nitride layer and the substrate.

According to this application example, because an aluminum layer is disposed after titanium and titanium nitride layers having been disposed, the crystal plane orientation of the aluminum layer can be aligned. To be more specific, the plane orientation of the titanium layer is aligned to (001), the plane orientation of the titanium nitride layer is aligned to (111), and the plane orientation of the aluminum layer is aligned to (111). Accordingly, the alignment of the reflective metal film (aluminum) can be strengthened, the generation of unevenness in the surface of the reflective metal film can be suppressed, and the reflectance can be increased.

APPLICATION EXAMPLE 7

It is preferable in the electro-optical device according to the above application example that the seed lamination film include a silicon oxide layer which contains boron and phosphorus and is disposed between the titanium layer and the substrate.

According to this application example, because titanium and titanium nitride layers are disposed after BPSG having been disposed in the lowest layer, crystal plane orientations can be aligned. To be more specific, the plane orientation of the titanium layer is aligned to (001), the plane orientation of the titanium nitride layer is aligned to (111), and the plane orientation of the aluminum layer is aligned to (111). Because of this, it is possible to strengthen the alignment of the reflective metal film (aluminum), suppress the generation of unevenness in the reflective metal film surface, and increase the reflectance.

APPLICATION EXAMPLE 8

A manufacturing method for an electro-optical device according to this application example includes forming a sacrifice layer on one surface of a substrate, forming a seed lamination film for aligning crystal plane orientations on the sacrifice layer, forming a reflective metal film on the seed lamination film, forming a reflection enhancing lamination film so as to cover at least a part of a surface of the reflective metal film on the opposite side to the substrate, a side surface of the reflective metal film, and a side surface of the seed lamination film, and forming a mirror by removing the sacrifice layer.

According to this application example, because the reflection enhancing lamination film is so formed as to cover the surface and side surface of the reflective metal film and the side surface of the seed lamination film, the surface and side surface of the reflective metal film and the side surface of the seed lamination film can be suppressed from being oxidized. As such, it is possible to suppress the micro mirror, which is provided with the reflective metal film and the seed lamination film, from being bent and increase the reflectance of the micro mirror.

APPLICATION EXAMPLE 9

It is preferable in the manufacturing method for the electro-optical device according to the above application example that the reflective metal film be made of aluminum, and the forming of the reflection enhancing lamination film include forming a silicon oxide layer on the aluminum layer and forming a silicon nitride layer on the silicon oxide layer.

According to this application example, because the aluminum layer is covered with the lamination film including the silicon oxide layer and the silicon nitride layer, it is possible to form the reflection enhancing lamination film by making use of a difference in reflectance between the materials. As such, strength of light incident on the micro mirror can be enhanced, and the brightness of light can be raised.

APPLICATION EXAMPLE 10

It is preferable in the manufacturing method for the electro-optical device according to the above application example that the forming of the seed lamination film include forming a silicon oxide layer containing boron and phosphorus on the sacrifice layer, forming a titanium layer on the silicon oxide layer containing boron and phosphorus, and forming a titanium nitride layer on the titanium layer.

According to this application example, because titanium and titanium nitride layers are formed after BPSG (silicon oxide layer containing boron and phosphorus) having been formed on the sacrifice layer, crystal plane orientations can be aligned. Specifically, the plane orientation of the titanium layer is aligned to (001), the plane orientation of the titanium nitride layer is aligned to (111), and the plane orientation of the reflective metal film (aluminum) is aligned to (111). As such, it is possible to strengthen the alignment of the reflective metal film, suppress the generation of unevenness in the reflective metal film surface, and increase the reflectance. In addition, because the BPSG is formed in the lowest layer of the micro mirror, a lower surface of the seed lamination film can be suppressed from being oxidized.

APPLICATION EXAMPLE 11

An electronic apparatus according to this application example includes the above-described electro-optical device.

According to this application example, it is possible to provide an electronic apparatus capable of improving the quality of display.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments that specify the invention will be described with reference to the drawings. Note that the drawings referred to in the description are illustrated being enlarged or reduced as needed in order to make the portions to be discussed visually recognizable.

In the following embodiments, when an expression of "on a/the substrate" is given, for example, the expression means a case in which a constituent element is disposed on the substrate in contact with the substrate, a case in which a constituent element is disposed on the substrate with another constituent element interposed therebetween, or a case in which a part of a constituent element is disposed on the substrate in contact with the substrate and another part of the constituent element is disposed on the substrate with another constituent element interposed therebetween.

First Embodiment

Configuration of Projector as Electronic Apparatus

Figure 1:
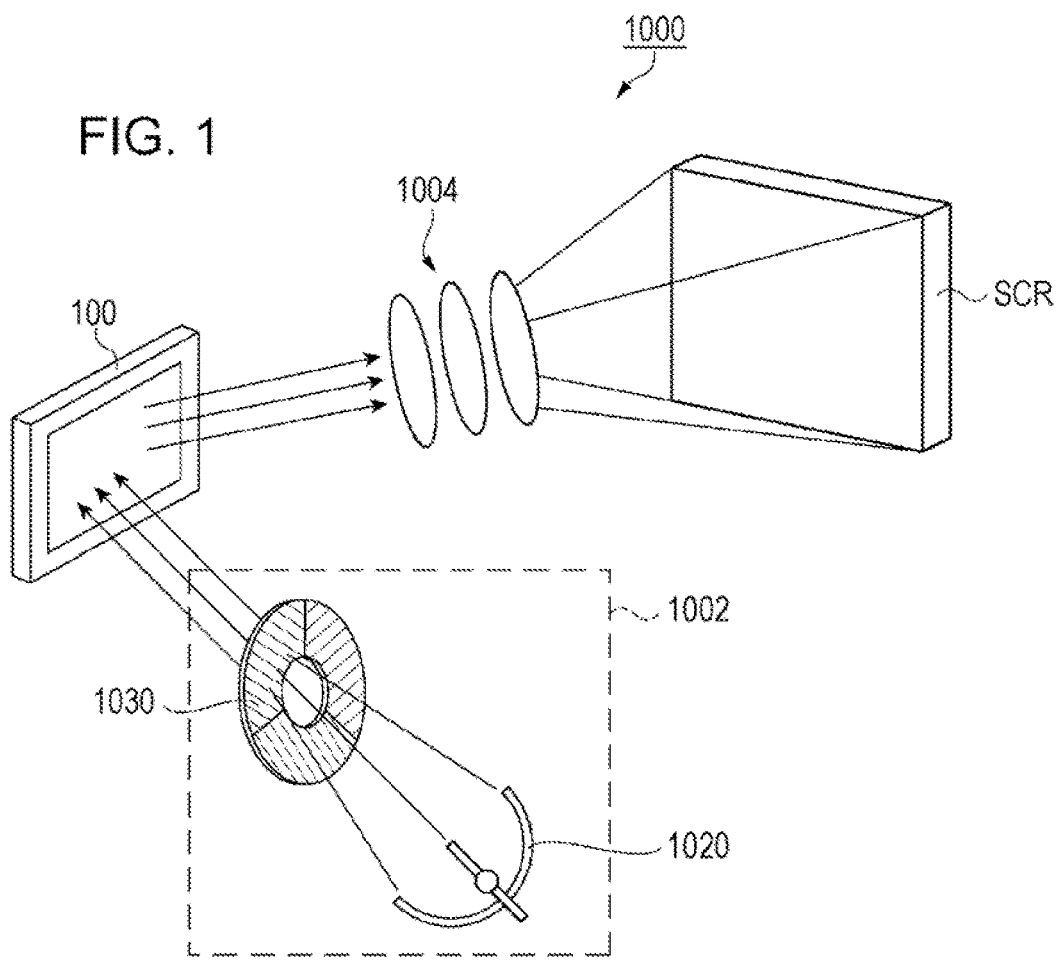
FIG. 1 is a schematic diagram illustrating an optical system of a projector as an electronic apparatus.

FIG. 1 is a schematic diagram illustrating an optical system of a projector as an electronic apparatus. Hereinafter, the optical system of the projector will be described with reference to FIG. 1.

As shown in FIG. 1, a projector 1000 is configured by including a light source device 1002, a light deflection device 100 that modulates light emitted from the light source device 1002 in accordance with image information, and a projection optical system 1004 that projects the modulated light from the light deflection device 100 as a projection image.

The light source device 1002 includes a light-emitting element 1020 and a fluorescent substrate 1030. The light source device 1002 is a laser beam source configured to emit a blue laser beam (peak of light emission intensity: approximately 445 nm, for example). The fluorescent substrate 1030 is disposed in an optical path of the laser beam emitted from the light-emitting element 1020.

It is acceptable that an excitation light source configured to emit color light with a peak wavelength being other than 445 nm is used as the light-emitting element 1020, as long as the emitted light has a wavelength capable of exciting a fluorescent substance to be explained later. In addition, three light deflection devices may be used as a method to make the projection image brighter.

Configuration of Light Deflection Device as Electro-optical Device

Figure 2:
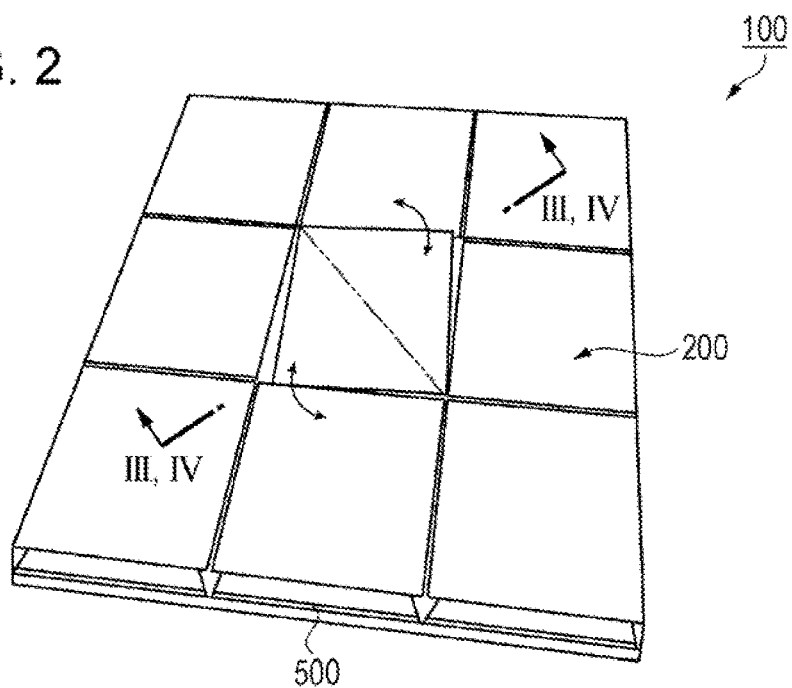
FIG. 2 is a schematic diagram illustrating a configuration of a light deflection device as an electro-optical device according to a first embodiment of the invention.
Figure 3:
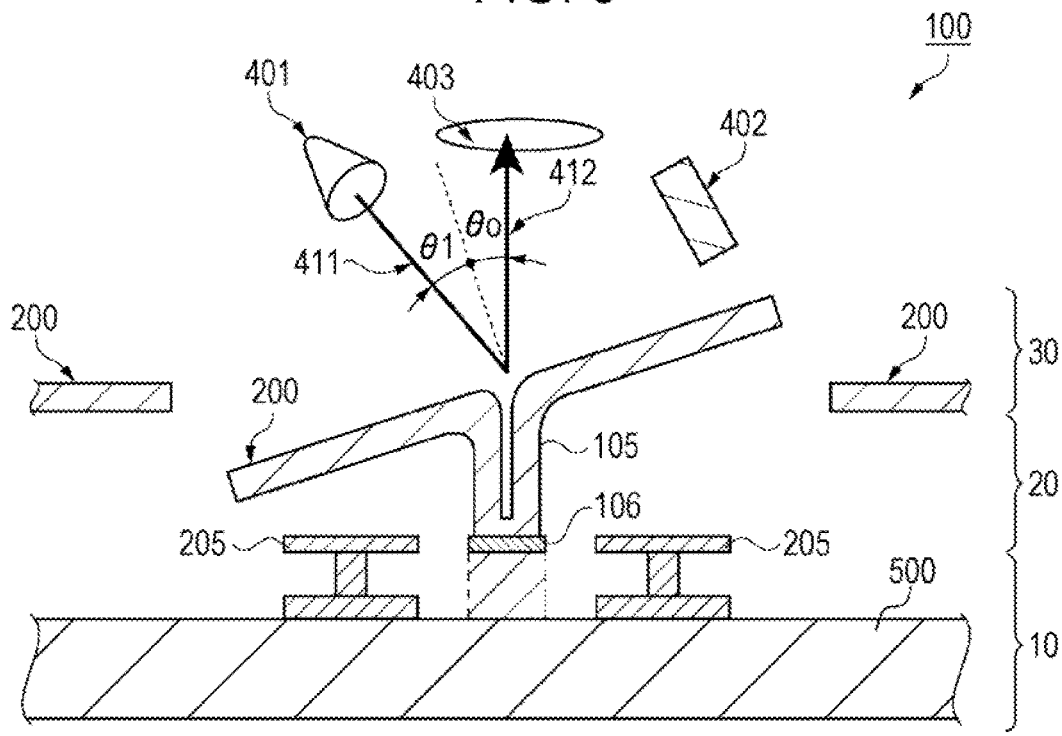
FIG. 3 is a schematic cross-sectional view of the electro-optical device taken along a line in FIG. 2.
Figure 4:
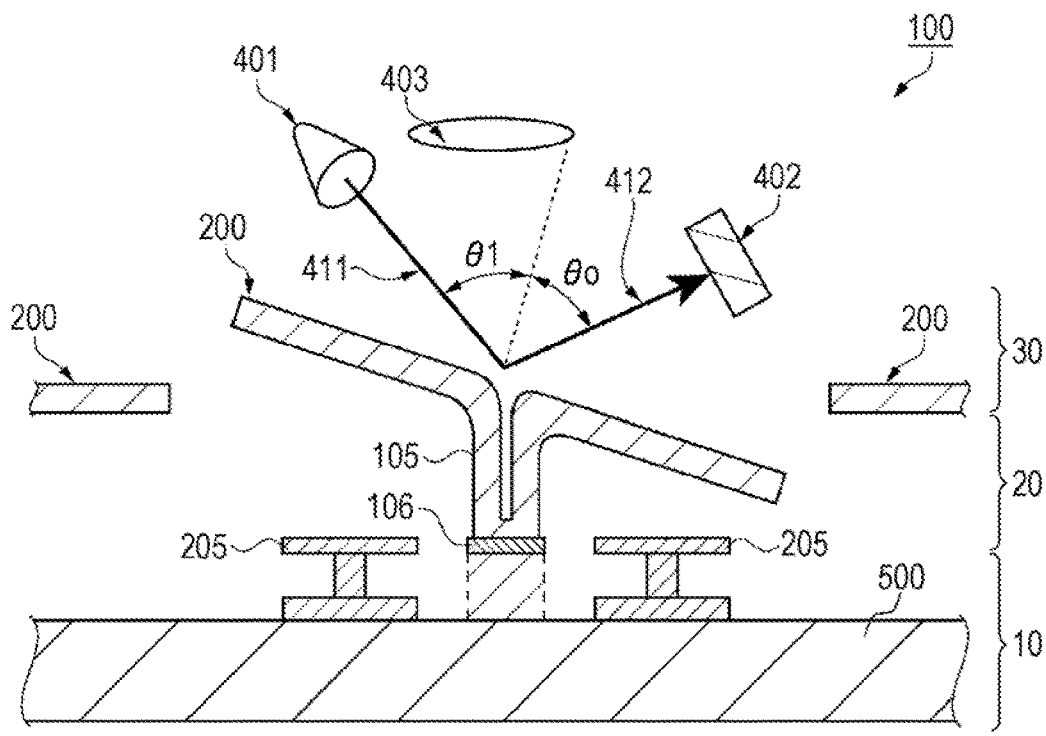
FIG. 4 is also a schematic cross-sectional view of the electro-optical device taken along a IV-IV line in FIG. 2.

FIG. 2 is a schematic diagram illustrating a configuration of the light deflection device as an electro-optical device. FIG. 3 and FIG. 4 are schematic cross-sectional views of the light deflection device respectively taken along a line and a IV-IV line in FIG. 2, and also the schematic cross-sectional views indicating operation of a mirror in the light deflection device. Hereinafter, the configuration and operation of the light deflection device will be described referring to FIGS. 2 through 4.

As shown in FIG. 2, in the light deflection device (DMD) 100, mirrors 200 are supported in matrix form above a wafer substrate 500 as a substrate via a hinge 106 and a support pillar 105 (see FIG. 3). The wafer substrate 500 is, for example, a silicon substrate. A reflective metal film to reflect light is formed on a surface of each of the mirrors 200. As the reflective metal film, an aluminum layer can be cited, for example.

As shown in FIG. 3, the light deflection device 100 according to this embodiment has three main sections; they are a bottom section 10 including a control circuit, an intermediate section 20 including electrodes 205 and the hinge 106, and an upper section 30 covered with the mirror 200 that is provided with an embedded torsion hinge and a cavity.

The bottom section 10 includes the wafer substrate 500 provided with an address specifying circuit for selectively controlling operations of reflective metal films 201 in the light deflection device 100. The address specifying circuit includes memory cells and wiring of word lines/bit lines for communication signals. The electrical address specifying circuit on the wafer substrate 500 can be assembled using standard CMOS techniques and resembles the SRAM (static random access memory).

The intermediate section 20 is configured of the electrodes 205, the hinge 106, and the support pillar 105. The electrode 205 is so designed as to increase capacitance coupling efficiency of electrostatic torque during an angle intersection transition. The mirror 200 is attracted to one of the electrodes 205 by an electrostatic force of the stated electrode 205. The hinge 106 is twisted when the mirror 200 is attracted to the electrode 205 and released from being twisted when no voltage is applied to the electrode 205. Since the electrostatic attracting force is inversely proportional to the square of a distance between the mirror 200 and the electrode 205, this effect becomes apparent when the mirror 200 is slanted at its landing position.

The upper section 30 includes the reflective metal film 201 which has a flat upper surface. The hinge 106 of the reflective metal film 201 is so formed as to be part of the reflective metal film 201. Further, on the lower side of the reflective metal film 201, a gap is provided maintaining a minimum distance through which rotation is made by a predetermined angle.

FIG. 3 shows a cross-sectional view of a part of the light deflection device 100 based on the embodiment of the invention when directional light 411 from an illumination light source 401 forms an incident angle θ1. In the case where measurement is performed on the light deflection device 100 in a regular direction, deflected light 412 holds an angle of θo. In a digital operation mode, this configuration is generally called a position of "ON".

FIG. 4 shows a cross-sectional view of the same part of the light deflection device 100 during the reflective metal film 201 rotating downward toward another electrode 205 on the opposite side of the hinge 106. The directional light 411 and the deflected light 412 form larger angles of θ1 and θ0, respectively. The deflected light 412 is emitted toward a light absorption device 402.

Figure 5:
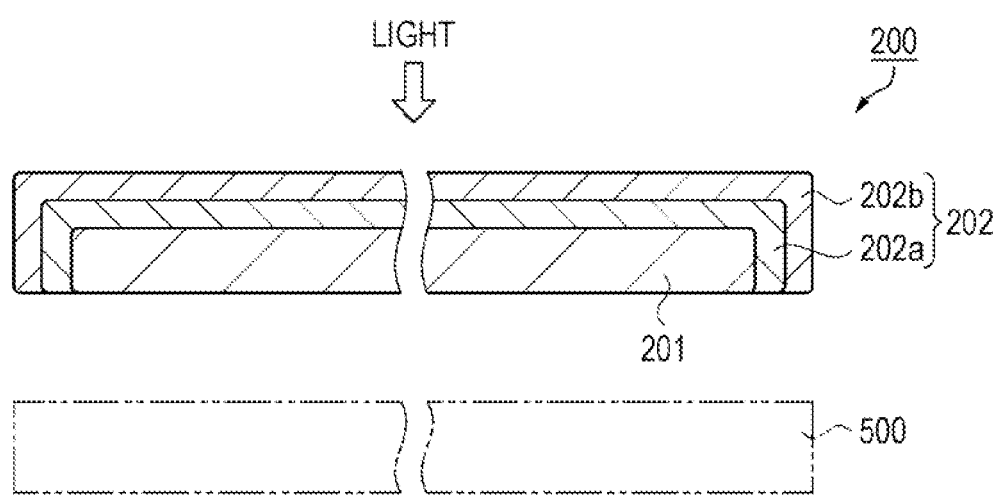
FIG. 5 is an enlarged cross-sectional view in which a part of a mirror shown in FIG. 3 is enlarged and illustrated.

FIG. 5 is an enlarged cross-sectional view in which a part of the mirror shown in FIG. 3 is enlarged and illustrated. Hereinafter, a configuration of the mirror will be described with reference to FIG. 5.

As shown in FIG. 5, the mirror 200 includes the reflective metal film 201 and a reflection enhancing lamination film 202 as an oxide film disposed on the light incident side of the reflective metal film 201. As a material of the reflective metal film 201, aluminum (Al), which has high reflectance and is easy to be processed, can be cited, for example. Aside from aluminum, an aluminum alloy, titanium, silver, gold, hafnium, zirconium, tantalum, and the like can be cited.

In the reflection enhancing lamination film 202, a first reflection enhancing film 202a as a first oxide film and a second reflection enhancing film 202b as a second oxide film are laminated in that order from the reflective metal film 201 side. The first reflection enhancing film 202a is made of, for example, silicon oxide ($SiO_2$). The second reflection enhancing film 202b is made of, for example, silicon nitride (SiN). The refractive index of silicon nitride is larger than that of silicon oxide.

The reflectance of incident light can be increased in the case where the phases of beams of light reflected at the surfaces of the second reflection enhancing film 202b, the first reflection enhancing film 202a, and the reflective metal film 201 match one another.

As described above, since the reflection enhancing lamination film 202 covers the reflective metal film 201, it is possible to strengthen the intensity of light incident on the mirror 200 and raise the brightness of light. In other words, the reflectance can be increased.

Further, the reflection enhancing lamination film 202 is so formed as to cover the surface and the side surface of the reflective metal film 201. This makes it possible to suppress the surface and side surface of the reflective metal film 201 from being oxidized, suppress the reflective metal film 201 from being bent, and suppress the reflectance of the mirror 200 from being lowered.

The reflection enhancing lamination film 202 can increase reflectance of a specific wavelength region. For example, the reflectance of light of red color can be increased by setting the thickness of the first reflection enhancing film 202a ($SiO_2$) to be 85 nm and the thickness of the second reflection enhancing film 202b (SiN) to be 85 nm.

The reflectance of light of green color can be increased by setting the thickness of the first reflection enhancing film 202a ($SiO_2$) to be 75 nm and the thickness of the second reflection enhancing film 202b (SiN) to be 75 nm.

Further, the reflectance of light of blue color can be increased by setting the thickness of the first reflection enhancing film 202a (SiO2) to be 60 nm and the thickness of the second reflection enhancing film 202b (SiN) to be 60 nm.

Manufacturing Method for Electro-optical Device

Figure 6:
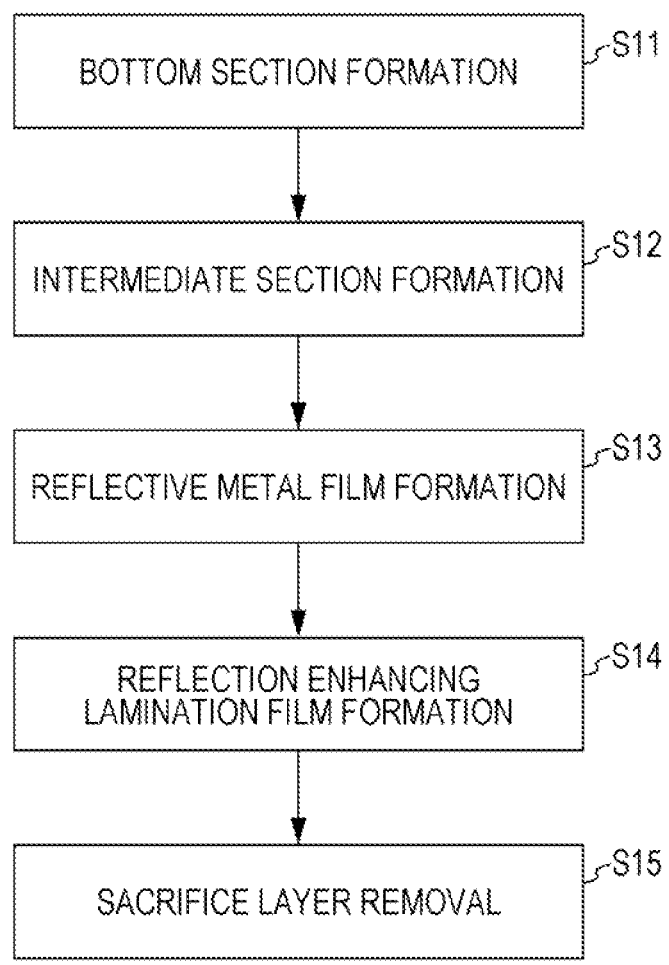
FIG. 6 is a flowchart illustrating a processing sequence of a manufacturing method for a light deflection device.

FIG. 6 is a flowchart illustrating a processing sequence of a manufacturing method for the light deflection device as an electro-optical device. FIGS. 7A through 7D and FIGS. 8A through 8C are schematic cross-sectional views illustrating a processing sequence of a part of the manufacturing method for the light deflection device. Hereinafter, the manufacturing method for the light deflection device will be described with reference to FIG. 6 through FIG. 8C.

Figure 7A:
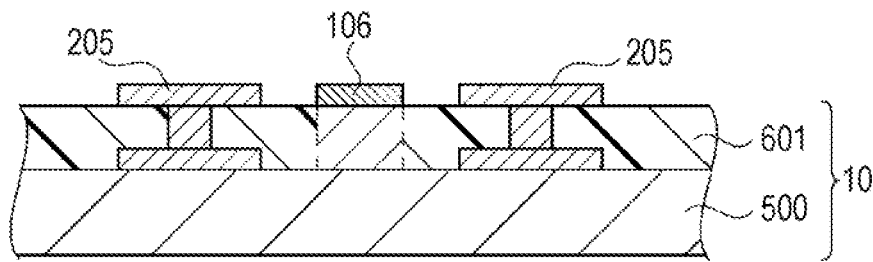
FIGS. 7A through 7D are schematic cross-sectional views illustrating a processing sequence of a part of a manufacturing method for a light deflection device.

First, a bottom section 10 is formed in step S11. Specifically, as shown in FIG. 7A, a control circuit (not shown) is formed on the wafer substrate 500 using a known technique. Thereafter, a first sacrifice layer 601 is deposited on a surface of the wafer substrate 500. The first sacrifice layer 601 can be formed by a photoresist spin-coat technique or an organic polymer PECVD technique. The first sacrifice layer 601 is cured through a series of heating and plasma processes, and the structure of the material is changed to a hydrophilic state from a hydrophobic state of polymer.

Next, the electrodes 205, the hinge 106, and the like are formed on the first sacrifice layer 601. The electrodes 205, the hinge 106, and the like are formed using the known techniques such as deposition, photolithography, etching, and so on.

Figure 7B:
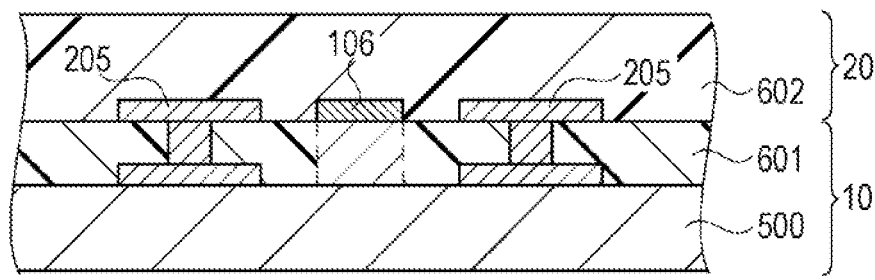

In step S12, the intermediate section 20 is formed. Specifically, as shown in FIG. 7B, a second sacrifice layer 602 with a thickness of approximately 1 µm is deposited on the first sacrifice layer 601. The second sacrifice layer 602 is formed in the same manner as the first sacrifice layer 601. The thickness of the sacrifice layer 602 defines height of the reflective metal film 201 on the hinge 106.

Figure 7C:
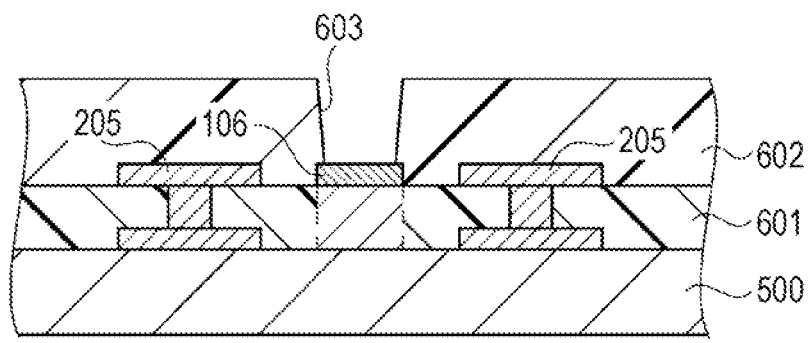
Figure 7D:
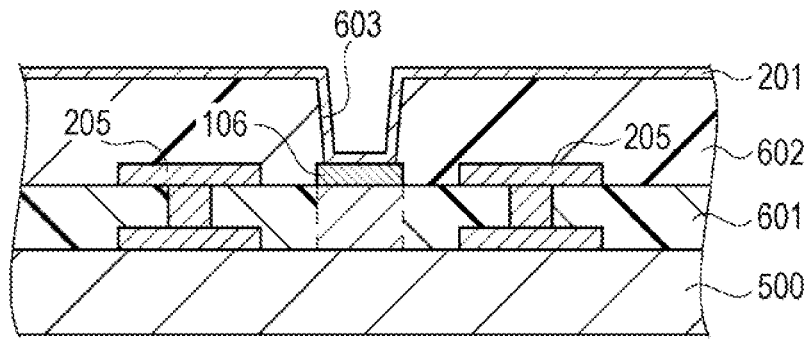

In step S13 (reflective metal film formation), the reflective metal film 201 that configures the upper section 30 is formed. Specifically, as shown in FIG. 7C, an opening portion 603 is first formed in the second sacrifice layer 602. As a method for forming the opening portion 603, an etching method using a mask can be cited, for example. With this, a surface of the hinge 106 is exposed as shown in FIG. 7C. Thereafter, as shown in FIG. 7D, the reflective metal film 201 is deposited across the overall area on the wafer substrate 500.

Figure 8A:
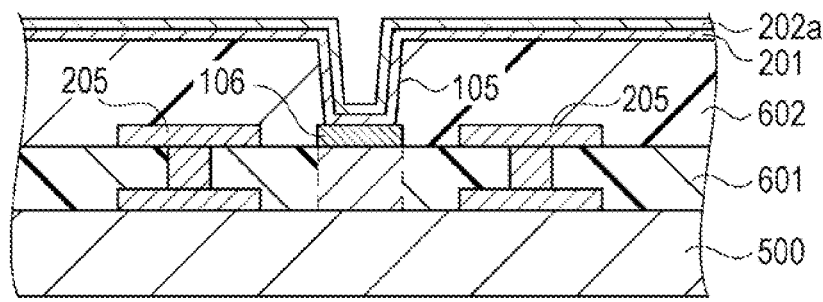
FIGS. 8A through 8C are schematic cross-sectional views illustrating a processing sequence of another part of the manufacturing method for the light deflection device.
Figure 8B:
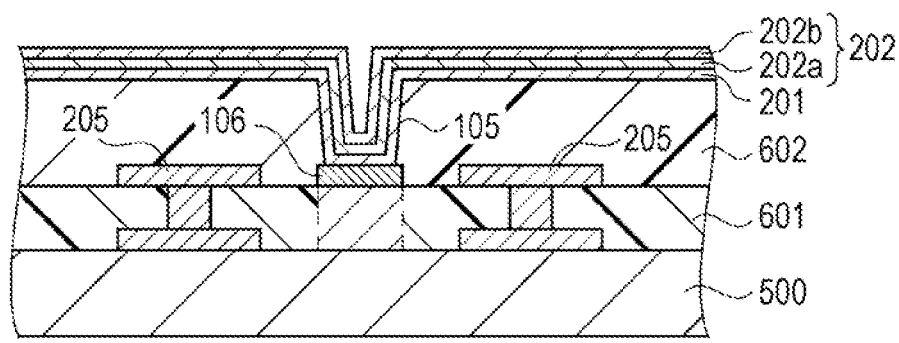

In step S14, the reflection enhancing lamination film 202 is formed. Specifically, as shown in FIG. 8A, the first reflection enhancing film 202a made of silicon oxide is formed so as to cover the surface and side surface of the reflective metal film 201 (see FIG. 5). Next, as shown in FIG. 8B, the second reflection enhancing film 202b made of silicon nitride is formed so as to cover the first reflection enhancing film 202a.

Figure 8C:
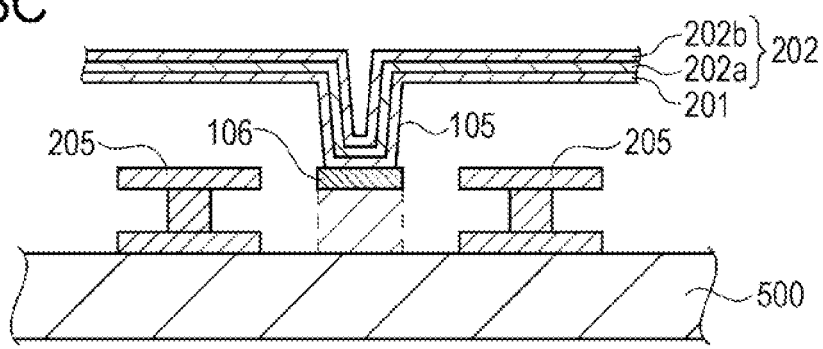

In step S15, the mirror 200 is formed by removing the first and second sacrifice layers 601 and 602. More specifically, as shown in FIG. 8C, the first and second sacrifice layers 601 and 602 are removed using a fluorine gas. Through this, the light deflection device 100 is completed.

As described above, because the reflection enhancing lamination film 202 is so formed as to cover the reflective metal film 201, the reflective metal film 201 can be suppressed from being oxidized (see FIG. 5). This makes it possible to suppress the reflective metal film 201 from being bent and suppress the reflectance of the mirror 200 from being lowered.

As described thus far, according to the light deflection device 100, the manufacturing method for the light deflection device 100, and the electronic apparatus of the first embodiment, the following effects can be obtained.

1. According to the light deflection device 100 and the manufacturing method for the light deflection device 100 of the first embodiment, because the reflection enhancing lamination film 202 is so formed as to cover the surface and side surface of the reflective metal film 201, it is possible to suppress the surface and side surface of the reflective metal film 201 from being oxidized when the device is in contact with air. As such, the mirror 200 including the reflective metal film 201 can be suppressed from being bent, thereby making it possible to increase the reflectance of the mirror 200.

2. According to the light deflection device 100 and the manufacturing method for the light deflection device 100 of the first embodiment, because the reflection enhancing lamination film 202 is formed on the reflective metal film 201, it is possible to strengthen the intensity of light incident on the mirror 200 and raise the brightness of light. In other words, the reflectance can be increased.

3. According to the electronic apparatus of this embodiment, because the apparatus includes the light deflection device 100, the electronic apparatus that is capable of improving display quality can be provided.

Second Embodiment

Configuration of Light Deflection Device

Figure 9:
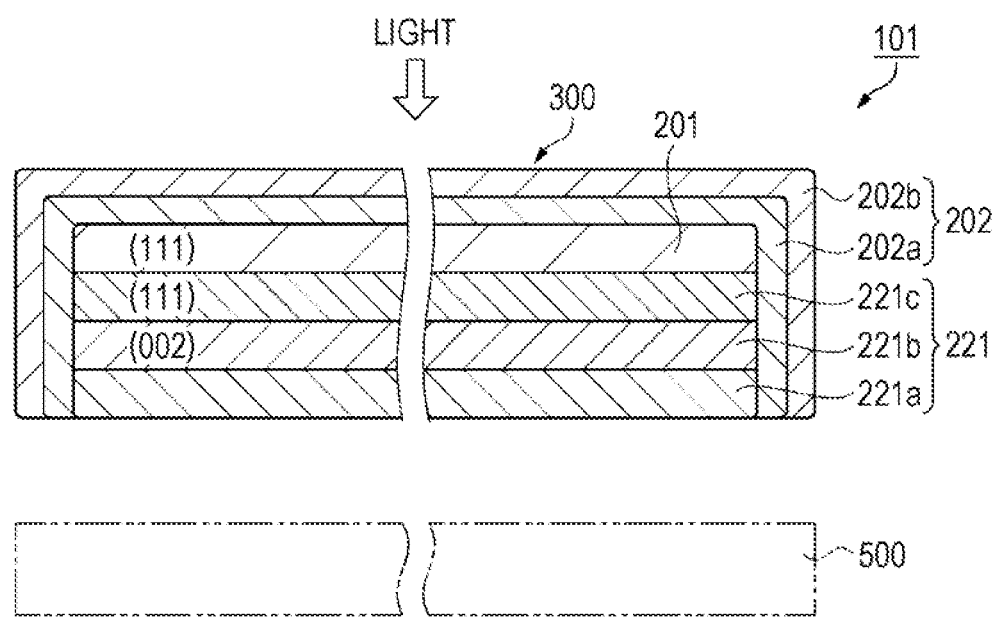
FIG. 9 is a schematic cross-sectional view illustrating a configuration of a light deflection device according to a second embodiment of the invention.

FIG. 9 is a schematic cross-sectional view illustrating a configuration of a light deflection device according to a second embodiment of the invention. Hereinafter, the configuration of the light deflection device of the second embodiment will be described with reference to FIG. 9.

A light deflection device 101 of the second embodiment differs from the light deflection device of the first embodiment in that the configuration of a mirror 300 is different from the configuration of the mirror of the first embodiment; however, other constituent elements are substantially the same as those of the first embodiment. Therefore, in the second embodiment, portions that are different from the first embodiment will be described in detail, and descriptions of redundant portions will be appropriately omitted.

As shown in FIG. 9, in the mirror 300 configuring the light reflection device 101, a seed lamination film 221, the reflective metal film 201, and the reflection enhancing lamination film 202 are disposed in that order from the substrate 500 side. The configuration of the reflective metal film 201 and the configuration of the reflection enhancing lamination film 202 are the same as those of the first embodiment.

The seed lamination film 221 is configured of a first seed film 221a, a second seed film 221b, and a third seed film 221c disposed in that order from the lowest layer (from the substrate 500 side). A material of the first seed film 221a is silicon oxide containing boron and phosphorus (BPSG). A material of the second seed film 221b is titanium (Ti). A material of the third seed film 221c is titanium nitride (TiN).

By disposing the first seed film 221a formed of BPSG in the lowest layer, the crystal plane orientation of the second seed film 221b is aligned to (002) in the case where the second seed film 221b made of titanium is formed on the first seed film 221a through the epitaxial growth. Further, in the case where the third seed film 221c made of titanium nitride is formed on the second seed film 221b through the epitaxial growth, the crystal plane orientation of the third seed film 221c is aligned to (111). Then, in the case where the reflective metal film 201 made of aluminum is formed on the third seed film 221c through the epitaxial growth, the crystal plane orientation of the reflective metal film 201 is aligned to (111).

BPSG is capable of aligning crystal plane orientations. As such, in the case where titanium and titanium nitride layers are formed on BPSG and then an aluminum layer is formed thereupon, the alignment of the reflective metal film 201 made of aluminum is strengthened, and the generation of unevenness in the surface is suppressed so that flatness of the surface is improved. As a result, the reflectance is increased.

On the reflective metal film 201, like in the first embodiment, the reflection enhancing lamination film 202 configured of the first reflection enhancing film 202a and the second reflection enhancing film 202b is provided.

According to this, the crystal plane orientation of the reflective metal film 201 can be aligned to (111) (in other words, the alignment can be strengthened), and the generation of unevenness in the surface of the reflective metal film 201 can be suppressed. In addition, since the first seed film 221a formed of BPSG is disposed in the lowest layer of the mirror 300, it is possible to suppress the reflective metal film 201, the second seed film 221b, the third seed film 221c, and the like from being oxidized.

Further, because the reflection enhancing lamination film 202 is so formed as to cover the side surfaces of the reflective metal film 201 and the seed lamination film 221, the stated side surfaces can be suppressed from being oxidized. This makes it possible to suppress the mirror 300 from being bent. As a result, the reflectance of the mirror 300 can be suppressed from being lowered.

Figure 10:
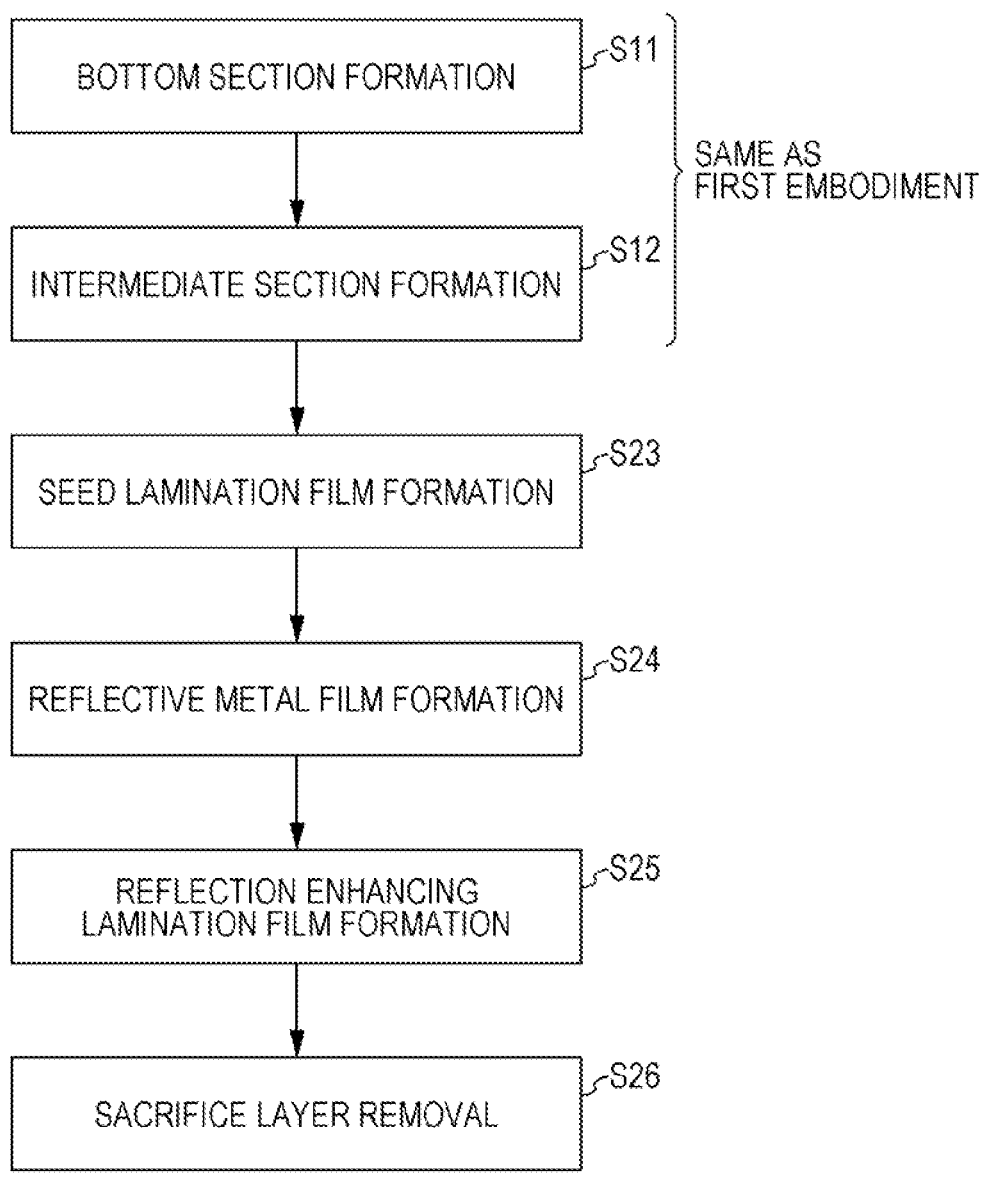
FIG. 10 is a flowchart illustrating a processing sequence of a manufacturing method for a light deflection device.

Note that a manufacturing method for the light deflection device 101 of the second embodiment is substantially the same as the manufacturing method for the light deflection device 100 of the first embodiment. Manufacturing Method for Electro-optical Device FIG. 10 is a flowchart illustrating a processing sequence of a manufacturing method for the light deflection device as an electro-optical device of the second embodiment. Hereinafter, the manufacturing method for the light reflection device will be described with reference to FIG. 10.

Bottom section formation carried out in step S11 and intermediate section formation carried out in step S12 are the same as those in the first embodiment.

In step S23, the seed lamination film 221 is formed on the intermediate section 20 (first and second sacrifice layers 601 and 602). To be more specific, the first seed film 221a made of BPSG for aligning crystal plane orientations is formed on the second sacrifice layer 602 first. As a manufacturing method for the first seed film 221a, a CVD technique can be used, for example.

Thereafter, the second seed film 221b made of titanium is formed on the first seed film 221a through the epitaxial growth. This makes the crystal plane orientation of the second seed film 221b be aligned to (002). Next, the third seed film 221c made of titanium nitride is formed on the second seed film 221b through the epitaxial growth. With this, the crystal plane orientation of the third seed film 221c is aligned to (111).

In step S24, the reflective metal film 201 is formed on the seed lamination film 221. Specifically, aluminum is disposed through the epitaxial growth so as to cover the seed lamination film 221.

Forming the reflective metal film 201 in the manner described above makes it possible to align the crystal plane orientation of the reflective metal film 201 to (111) and flatten the surface of the reflective metal film 201. In other words, roughness in the surface of the reflective metal film 201 is small. Accordingly, the reflectance can be increased.

The reflection enhancing lamination film 202 is formed in step S25. Specifically, the first reflection enhancing film 202a made of silicon oxide is so formed as to cover the surface and side surface of the reflective metal film 201 and the side surface of the seed lamination film 221 on the lower layer side of the reflective metal film 201. Next, the second reflection enhancing film 202b made of silicon nitride is so formed as to cover the first reflection enhancing film 202a (see FIG. 9).

In step S26, the mirror 300 is formed by removing the first and second sacrifice layers 601 and 602. More specifically, the first and second sacrifice layers 601 and 602 are removed using a fluorine gas. Through this, the light deflection device 101 is completed.

As described in detail thus far, according to the light deflection device 101 of the second embodiment, the following effects can be obtained.

4. According to the light reflection device 101 of the second embodiment, because the second seed film 221b made of titanium and the third seed film 221c made of titanium nitride are formed after the first seed film 221a made of BPSG having been formed on the first and second sacrifice layers 601 and 602, crystal plane orientations can be aligned. To be more specific, the plane orientation of the titanium layer is aligned to (002), the plane orientation of the titanium nitride layer is aligned to (111), and the plane orientation of the aluminum layer is aligned to (111). As such, it is possible to strengthen the alignment of the reflective metal film 201, suppress the generation of unevenness in the surface of the reflective metal film 201, and increase the reflectance. In addition, because the first seed film 221a is formed in the lowest layer of the mirror 300, the lower surface of the seed lamination film 221 can be suppressed from being oxidized. This makes it possible for stray light to be absorbed without being reflected, whereby the stray light is prevented from giving harmful influence on display quality, causing a leakage current to flow, and so on. Moreover, because the reflection enhancing lamination film 202 is formed on the reflective metal film 201, the reflectance can be further increased.

The aspects of the invention are not limited to the above-described embodiments, and can be appropriately modified without departing from the scope and spirit of the invention understood from the appended aspects of the invention as well as the overall contents of the specification; note that such modifications are also included in the technical scope of the aspects of the invention. Further, the aspects of the invention can be embodied as follows.

Variation 1

Figure 11:
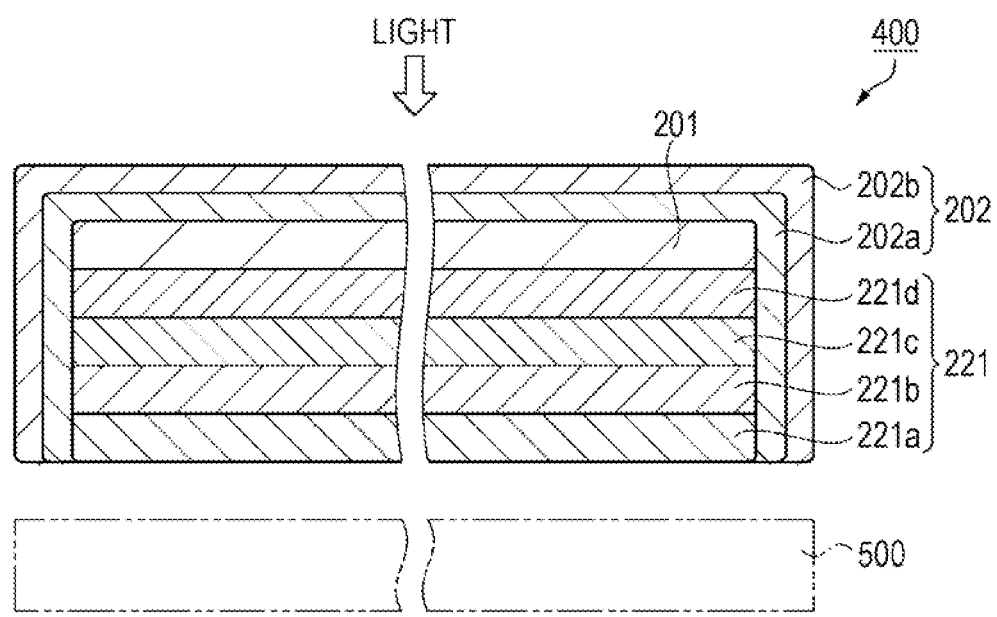
FIG. 11 is a schematic cross-sectional view illustrating a configuration of a mirror according to a variation.

The seed lamination film 221 is not limited to the formation of three layers (first seed film 221a, second seed film 221b, third seed film 221c) like the above-described second embodiment, and may be configured as shown in FIG. 11.

FIG. 11 is a schematic cross-sectional view illustrating a configuration of a mirror 400. The mirror 400 shown in FIG. 11 differs from the mirror of the second embodiment in a point that a fourth seed film 221d is provided between the third seed film 221c and the reflective metal film 201.

A material of the fourth seed film 221d is titanium (Ti). Although the number of manufacturing processes to be carried out is increased by configuring the seed lamination film 221 with four layers as described above, the plane orientation of the reflective metal film 201 made of aluminum can be further aligned and the reflectance can be further increased. To be more specific, in the case where the reflective metal film 201 is formed on the fourth seed film 221d, a difference in coefficient of thermal expansion is small and the surface of the reflective metal film 201 is unlikely to become rough in comparison with a case in which the reflective metal film 201 is formed on the third seed film 221c (titanium nitride).

Variation 2

As described above, as electronic apparatuses in which the light deflection device 100 is mounted and used, in addition to the projector 1000, various types of electronic apparatuses can be cited such as a head-up display (HUD), a head mount display (HMD), a mobile mini-projector, an on-vehicle apparatus, an audio system, an exposure apparatus, an illumination apparatus, and so on.

The entire disclosure of Japanese Patent Application No. 2014-157458, filed Aug. 1, 2014 is expressly incorporated by reference herein.

What is claimed is:

1. An electro-optical device comprising:
    a substrate;
    a mirror that includes a reflective metal film and is disposed above one surface of the substrate so as to be distanced from the substrate;
    a support section that is disposed between the substrate and the mirror, the support section has a portion connected to part of the mirror to support the mirror; and
    a reflection enhancing lamination film that includes a first film and a second film, the reflection enhancing lamination film covering and being directly disposed on the mirror from one outer side surface of the mirror to another outer side surface of the mirror across a surface of the mirror on an opposite side to the substrate.

2. The electro-optical device according to claim 1, wherein the second film has a larger refractive index than the first film and is disposed on a side of the first film opposite to the reflective metal film.

3. The electro-optical device according to claim 2, wherein the first film is silicon oxide, and the second film is silicon nitride.

4. The electro-optical device according to claim 1, wherein the reflective metal film is made of aluminum.

5. The electro-optical device according to claim 1, wherein the mirror includes, between the reflective metal film and the substrate, a seed lamination film for aligning crystal plane orientations.

6. The electro-optical device according to claim 5, wherein the seed lamination film is a lamination film including a titanium nitride layer which is disposed between the reflective metal film and the substrate, and a titanium layer which is disposed between the titanium nitride layer and the substrate.

7. The electro-optical device according to claim 6, wherein the seed lamination film includes a silicon oxide layer that contains boron and phosphorus and is disposed between the titanium layer and the substrate.

8. A manufacturing method for an electro-optical device comprising:
    forming a sacrifice layer on one surface of a substrate;
    forming a seed lamination film for aligning crystal plane orientations on the sacrifice layer;
    forming a reflective metal film on the seed lamination film;
    forming a reflection enhancing lamination film that includes a first film and a second film such that the first film and the second film cover a surface of the reflective metal film on an opposite side to the substrate, at least a part of an outer side surface of the reflective metal film, and at least a part of a side surface of the seed lamination film; and
    forming a mirror by removing the sacrifice layer.

9. The manufacturing method for the electro-optical device according to claim 8, wherein the reflective metal film is made of aluminum, and the forming of the reflection enhancing lamination film includes forming a silicon oxide layer on the aluminum layer and forming a silicon nitride layer on the silicon oxide layer.

10. The manufacturing method for the electro-optical device according to claim 8, wherein the forming of the seed lamination film includes forming a silicon oxide layer containing boron and phosphorus on the sacrifice layer, forming a titanium layer on the silicon oxide layer containing boron and phosphorus, and forming a titanium nitride layer on the titanium layer.

11. An electronic apparatus comprising the electro-optical device according to claim 1.

12. The electro-optical device according to claim 1, wherein the first film and the second film cover the surface of the mirror on the opposite side to the substrate and the outer side surfaces of the mirror continuously.

13. The electro-optical device according to claim 1, wherein the reflection enhancing lamination film is a reflection increasing lamination film.

14. The electro-optical device according to claim 1, wherein the reflective metal film is a non-oxide metal.

15. The electro-optical device according to claim 1, wherein the reflection enhancing lamination film is disposed so as to directly cover a whole surface of the mirror on the opposite side to the substrate and whole surfaces of the outer side surfaces of the mirror.

16. The electro-optical device according to claim 1, wherein the reflection enhancing lamination film is disposed only on the surface of the mirror on the opposite side to the substrate and on the outer side surfaces of the mirror.

17. An electro-optical device comprising:

a substrate;

a mirror that includes a reflective metal film and is disposed above one surface of the substrate so as to be distanced from the substrate;

a support section that is disposed between the substrate and the mirror, the support section has a portion connected to part of the mirror to support the mirror; and a reflection enhancing lamination film that is disposed so as to cover and be directly disposed on the mirror from one outer side surface of the mirror to another outer side surface of the mirror across a whole surface of the mirror on an opposite side to the substrate.

18. The electro-optical device according to claim 17, wherein the reflection enhancing lamination film is disposed so as to directly cover the whole surface of the mirror on the opposite side to the substrate and whole surfaces of the outer side surfaces of the mirror.

19. The electro-optical device according to claim 17, wherein the reflection enhancing lamination film is disposed only on the whole surface of the mirror on the opposite side to the substrate and on the outer side surfaces of the mirror.

* * * * *